(12) United States Patent
Bhawmik

(10) Patent No.: US 6,370,664 B1
(45) Date of Patent: Apr. 9, 2002

(54) METHOD AND APPARATUS FOR PARTITIONING LONG SCAN CHAINS IN SCAN BASED BIST ARCHITECTURE

(75) Inventor: Sudipta Bhawmik, Monmouth Junction, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/182,543

(22) Filed: Oct. 29, 1998

(51) Int. Cl.[7] .............................................. G01R 31/28
(52) U.S. Cl. ...................... 714/729; 714/727; 714/733; 714/726
(58) Field of Search ................................ 714/727, 731, 714/733, 729, 726, 728; 377/80; 327/34

(56) References Cited

U.S. PATENT DOCUMENTS

| 5,043,986 A | | 8/1991 | Agrawal et al. ............ 371/25.1 |
|---|---|---|---|
| 5,202,625 A | * | 4/1993 | Farwell ....................... 714/727 |
| 5,210,759 A | * | 5/1993 | DeWitt et al. ............... 714/731 |
| 5,329,533 A | | 7/1994 | Lin ............................ 371/22.3 |
| 5,367,551 A | * | 11/1994 | Okumura et al. ............. 377/80 |
| 5,440,178 A | * | 8/1995 | McClure ...................... 327/34 |
| 5,448,575 A | * | 9/1995 | Hashizume ................. 714/727 |
| 5,450,414 A | | 9/1995 | Lin ............................ 371/22.3 |
| 5,473,617 A | * | 12/1995 | Farwell ...................... 714/727 |
| 5,726,998 A | * | 3/1998 | Ozaki ......................... 714/726 |

* cited by examiner

*Primary Examiner*—David Ton
(74) *Attorney, Agent, or Firm*—Synnestvedt & Lechner LLP

(57) ABSTRACT

A technique is provided for testing an IC which includes a plurality of flip-flops. The flip-flops are arranged in at least one scan chain. The testing technique of the invention is practiced by selectively partitioning the scan chain into smaller scan chains so that the smaller chains can be simultaneously latched and provide test results. The scan chain is switchable between a partitioned and a non-partitioned configuration, so that either configuration can be selected on demand, thereby allowing both BIST and deterministic testing to be performed efficiently on the same circuit.

22 Claims, 3 Drawing Sheets

METHOD AND APPARATUS FOR PARTITIONING LONG SCAN CHAINS IN SCAN BASED BIST ARCHITECTURE

FIELD OF THE INVENTION

The present invention relates to the field of circuit testing and, in particular, to a technique for logically partitioning a scan chain into smaller chains to reduce the test application time during a Built-In-Self-Test (BIST) while still allowing full scan chain testing when desired.

BACKGROUND OF THE INVENTION

Integrated circuits (IC's) generally comprise a large number of individual circuit elements which may be combinational in nature, such as a gate, or sequential in nature, such as flip-flops. IC's are tested to ensure that the component is defect free after being manufactured and/or remains in proper working condition during use. Testing of both the combinational and sequential elements of an IC may be accomplished by applying a test pattern (often called a "test vector") to stimulate the inputs of the circuit and monitoring the output response to detect the occurrence of faults. The test patterns may be applied to the circuit using an external testing device. Alternatively, the test pattern may be generated by a BIST structure comprising part of the internal circuitry of the IC.

Test pattern generation is a relatively simple task for combinational circuit elements. However, for sequential circuit elements, test pattern generation is much more complex because it is necessary to propagate known values from element to element (e.g. from one flip-flop to the next) over time. Although it is desirable when testing the circuit to use exhaustive testing by checking the circuit output response to all possible input permutations (e.g., $2^n$ inputs for n input variables), this approach becomes impracticable as the number of input variables increases. Thus, a related technique, referred to as pseudo-random testing, is employed when the number of input variables is so large that it becomes impracticable to use an exhaustive testing approach. Pseudo-random testing is an alternative technique that generates test patterns in a random fashion from all of the possible patterns. In this approach, fewer than all of the possible patterns are tested. Because of the relatively low hardware overhead and the simplicity of test pattern generation, pseudo-random testing is a preferred technique for BIST. Practical circuits, however, often contain random pattern resistant faults which result in unacceptable low fault coverages for a reasonable test length. Under these circumstances the testability of the circuit may be improved by inserting test points into the circuit.

A technique called partial-scan testing is described in U.S. Pat. No. 5,034,986 (Agrawal et al.), incorporated by reference herein. Partial-scan testing involves partitioning of the circuit so that selected sequential elements in the circuit are arranged as a shift register. The circuit is initially placed in a test mode and a known stream of test data is shifted into the shift register. Thereafter, the IC is placed in its normal operating mode so as to react to the test data. Finally, the IC is returned to the test mode and the test data, modified by the operation of the IC, is shifted out from the shift register for comparison to a reference data stream.

An improved form of partial-scan testing is disclosed in U.S. Pat. No. 5,329,533 to Lin, which is incorporated herein by reference. In this development, the testing of the IC is improved by the addition of BIST circuitry, including a test pattern generator and a response analyzer (a compactor). Self-looping non-scan flip-flops in the circuit are replaced with initializable flip-flops so that the IC can be set to an initial state prior to testing to obtain a deterministic signature.

The scan chains for testing an IC can be thousands of elements long. Typically the time required to shift a test pattern into a single flip-flop is one cycle, and the time required to shift a test pattern out of a flip-flop is also one cycle. Thus, an IC with 1,000 elements would take 1,000 cycles to shift in the test vectors and an additional 1,000 cycles to shift them out.

In the past it has been known to use parallel chains to reduce the size of the shift registers. For example, instead of using a 1,000 bit shift register, two parallel 500 bit shift registers could be simultaneously loaded. Since each scan chain is shorter, the testing time will also be shorter. However, due to the constraints imposed by Automatic Test Equipment (ATE), available input/output pins, etc., the number of scan chains that can be used has to be limited. Thus, if an IC design is limited to use, for example, only 4 scan chains, and the total number of flip-flops is 20,000, each scan chain will still be 5000 elements long.

FIG. 1 illustrates a scan-based BIST structure in accordance with the prior art. As shown in FIG. 1, the scan-based BIST structure includes a test pattern generator 10 which supplies random patterns to the primary inputs 15 of the IC for supplying test vectors to the combinational elements 20 of the IC. In addition, the test pattern generator 10 also supplies random patterns, via a scan chain 21 comprising flip-flops $F1-F_n$, to pseudo-inputs 22 of combinational elements 20 (via outputs 24 of the scan flip-flops $F1-F_n$). Data from the primary outputs 30 of the IC and via the scan chain 21, from pseudo-outputs 26 of the combinational elements 20 (via the inputs 28 of the flip-flops $F1-F_n$) are output to a response analyzer 35 such as a multiple input signature register (MISR).

To begin testing, the IC is placed in a test mode during which the bits of a test vector are latched from test pattern generator 10 into the scan chain 21 via the first flip-flop F1 in the scan chain 21. After the test data is entered, the IC is returned to a non-test mode during which the combinational elements 20 respond to the previously received test data in their usual manner. A predetermined period of time later, the test mode is re-entered and the response of the combinational elements 20 to the data entered via the scan chain is output to the scan chain 21 via pseudo-outputs 28 and captured in the flip-flop $F1-F_n$. The captured data is then output to the response analyzer 35 where it is compacted.

The response analyzer 35 serves to compact output data generated by the combinational elements 20 with the captured data output from the scan chain 21 and compares the two to yield a deterministic signature which is descriptive of the entire circuit. By comparing the signature of the system with that for a fault-free system, the existence or absence of defects will be revealed.

One or more test points, e.g., control points and/or observation points, may be inserted into the circuit under test to improve the fault coverage as described in U.S. Pat. No. 5,450,414 to Lin, incorporated herein by reference. The observation points improve the ability to observe errors in the system.

Although it is feasible and desireable to have multiple scan chains of smaller sizes in a BISTed design, if the design also needs to be tested using deterministic scan vectors the number of scan chains may need to be restricted for the previously-explained reasons. Hence, it is desirable to have a feature in the BIST design such that in the BIST mode the scan chains can be configured into multiple parallel scan chains of smaller sizes, whereas in the deterministic scan test mode they can be configured into few number of scan chains as dictated by the external constraints. The prior art lacks this capability. The present invention solves this problem.

SUMMARY OF THE INVENTION

Briefly, in accordance with the invention, a technique is provided for testing an IC which includes a plurality of flip-flops. The flip-flops are arranged in at least one scan chain. The testing technique of the invention is practiced by selectively partitioning the scan chain into smaller scan chains so that the smaller chains can be simultaneously latched and provide test results. The scan chain is switchable between a partitioned and a non-partitioned configuration, so that either configuration can be selected on demand, thereby allowing both BIST and deterministic testing to be performed efficiently on the same circuit.

In a preferred embodiment, the present invention comprises a test system for testing an integrated circuit, the test system including a plurality of flip-flops arranged in a scan chain to effectuate scan testing of the integrated circuit and comprising a first stage including at least one of said flip-flops; a second stage including at least another one of said flip-flops; a switch coupled between the first stage and the second stage; a memory register storing a plurality of random test vectors for input to the scan chain, to the switch, and to the integrated circuit; and a response analyzer coupled to the integrated circuit for compacting the response generated by the integrated circuit with bits shifted out of the first and second stages. In a more preferred embodiment, the switch comprises an exclusive-OR gate, and the exclusive-OR gate includes a first input coupled to an output of the first stage, a second input coupled to the memory register, and an output coupled to the input of the second stage. The first stage includes an observation point coupled to the response analyzer to route the output of the first stage to the response analyzer.

DETAILED DESCRIPTION

Figure 2:
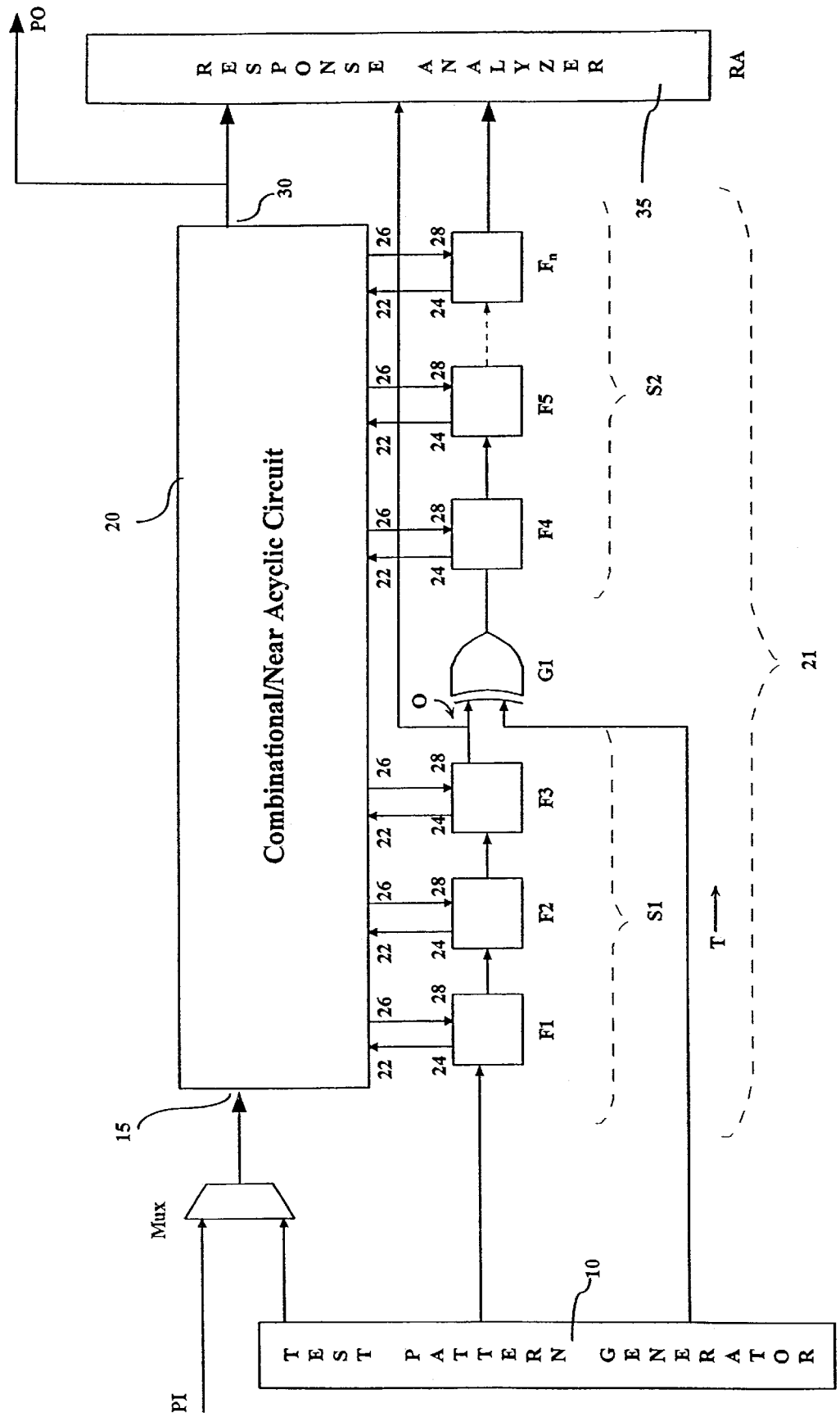
FIG. 2 is a block schematic diagram of an integrated circuit employing a scan chain partitionable into two stages in accordance with the present invention.

Referring to FIG. 2, the present invention comprises a technique for testing an IC which includes a combinational logic circuit or near acyclic circuit 20 and a shift register comprising sequential elements (flip-flops) F1, F2, F3 ... $F_n$ where n is an integer. In FIG. 2, six flip-flops F1 through $F_n$ are shown; however, this is for purposes of example only and it is understood that the scan chain could comprise less than 6 or many more than 6 without changing the scope of the invention. The number of sequential elements F1 through $F_n$ and the manner in which the elements are connected to combinational logic circuit 20 is dependent on the specific function(s) to be performed by the IC 10.

In the example shown in FIG. 2, to achieve the partitioning of the present invention, an EXCLUSIVE-OR (XOR) gate G1 is inserted into the scan chain path between flip-flop F3 and flip-flop F4 and an observation point O is added at the output of flip-flop F3. This partitions the scan chain 21 into a first stage S1 comprising flip-flops F1–F3 and a second stage S2 comprising flip-flops F4–$F_n$. XOR gate G1 has at least two inputs and a single output. One of the inputs of the XOR gate G1 is driven by the output of scan flip-flop F3 and the other input of XOR gate G1 is driven by a signal T from the test pattern generator 10. The output of exclusive-or gate G1 drives the scan input of the second stage S2 at flip-flop F4. The observation point O taps off of first stage S1 (at the output of flip-flop F3) and routes the output of first stage S1 to the response analyzer 35. Response analyzer 35 can comprise, for example, a Multiple Input Signature Register (MISR)

Figure 1:
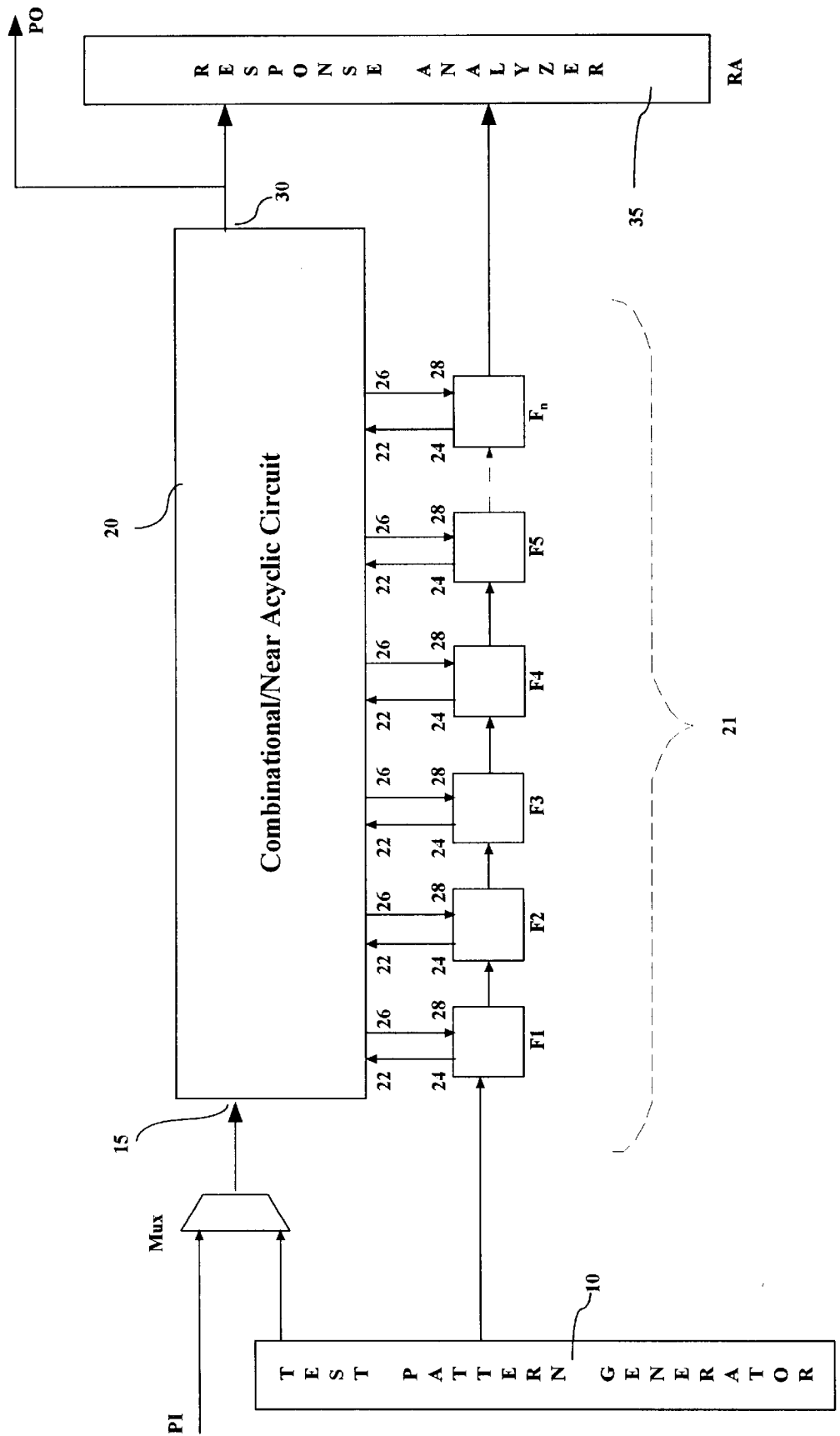
FIG. 1 is a block schematic diagram of a scan-based BIST integrated circuit according to the prior art.

As discussed previously, the prior art circuit of FIG. 1, in which 6 flip-flops are shown in the scan chain, will require 6 clock cycles to shift the test pattern into the scan chain and 6 clock cycles to shift the results out of the scan chain. In the exemplary partitioned scan chain according to the present invention shown in FIG. 2, the first stage S1 and the second stage S2 operate concurrently, cutting in half the time needed to shift the test pattern in and out of the scan chain 21 (3 clock cycles in and 3 clock cycles out).

A deterministic scan test is a method where a set of test vectors are generated apriori where each test vector detects a predetermined set of faults and the test vectors are then applied to the IC through the scan chains and primary inputs from an external source (e.g. an Automatic Test Equipment). The test is called deterministic because each test is generated for a specific targeted fault or fault set, vis-a-vis a random test where the test vectors are generated randomly. During the deterministic scan test application mode, the pattern generator outputs signal T (the input to the XOR gate) which is held at a logical 0 state. This essentially nullifies the effect of XOR gate G1 and allows for regular application of scan test vectors through the entire length of the scan chain 21. However, during a BIST mode, random patterns from the test generator 10 are fed simultaneously to the inputs of first stage S1 and second stage S2 (via XOR gate G1) and the responses are observed from the outputs of the two stages simultaneously. Thus, in only 3 clock cycles (instead of 6) the scan register can be loaded, and responses can be shifted out in 3 clock cycles. In effect, the present invention results in two parallel scan chains in the BIST mode.

Figure 3:
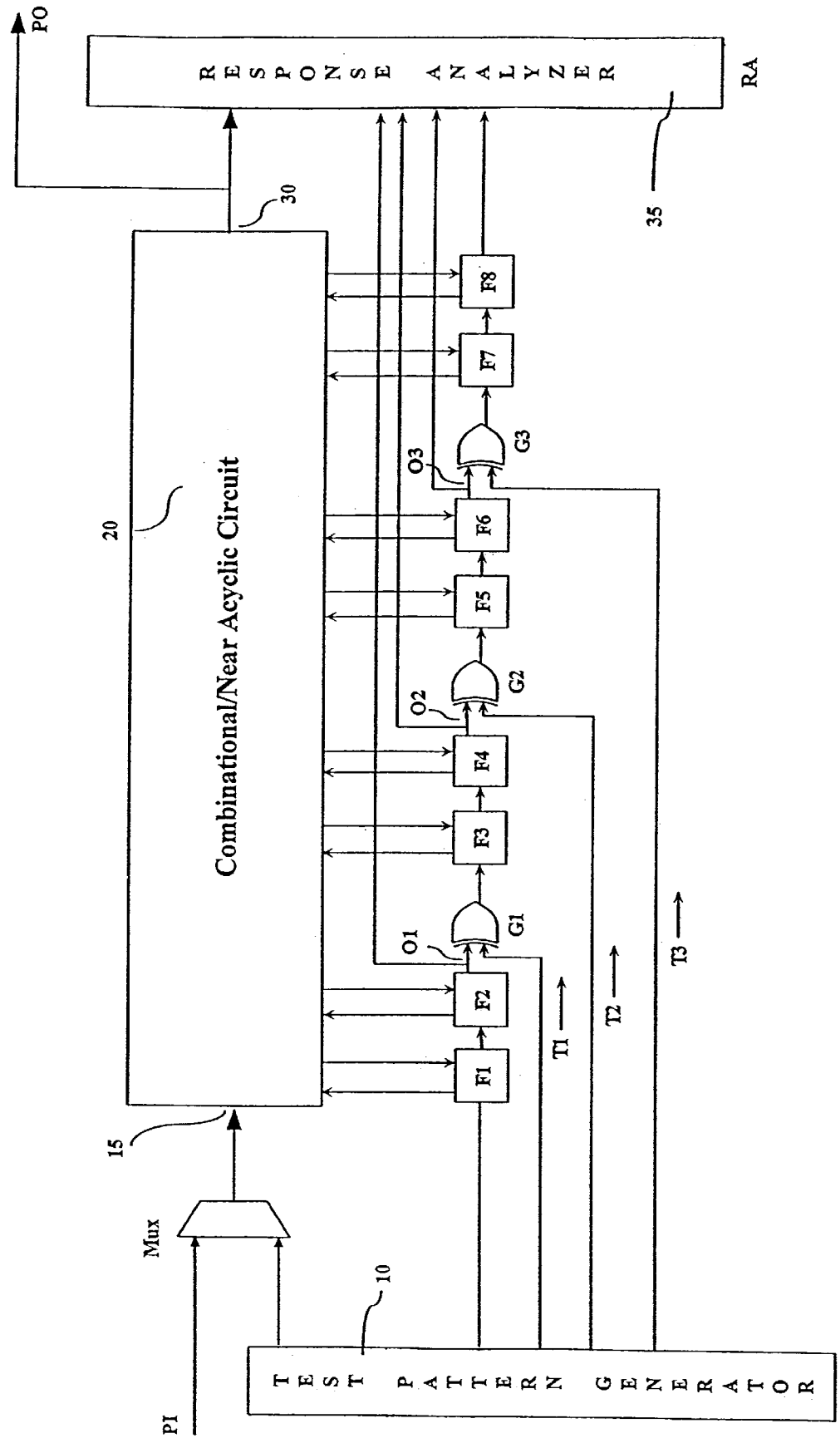
FIG. 3 is a block schematic diagram of an integrated circuit employing a scan chain partitionable into four stages in accordance with the present invention.

FIG. 3 shows an example of the present invention in which three XOR gates G1–G3 are implemented in the circuit to allow partitioning of the scan chain into two or four partitioned scan chains, depending upon the needs of the user. A scan chain can be partitioned into as many partitions as desired and thus it is understood that the example of FIG. 3 is representative of only one of many configurations that can be created. In the example shown in FIG. 3, it is possible to partition the long scan chain (F1–F8) into four separate stages (in BIST mode) comprising flip-flops F1–F2, F3–F4, F5–F6, and F7–F8, respectively. The partitioning is accomplished by inserting XOR gate G1 between flip-flops F2 and F3, XOR gate G2 between flip-flops F4 and F5, and XOR gate G3 between flip-flops F6 and F7. The XOR gates are then controlled, in the same manner as set forth above with respect to FIG. 2, to partition the scan chain as desired. If it is desired to have two partitioned chains in the BIST mode (each four flip-flops in length), then the test pattern generator is caused to drive the inputs to the XOR gates G1 and G3, via output signals T1 and T3, respectively, to a logical 0 state.

Insertion of the XOR gates into the scan chain allows an existing long scan chain to be partitioned into two or more shorter scan chains. This gives the user the flexibility of shifting all of the test data through the entire long scan chain by disabling all of the XOR gates, or partitioning the long scan chain into a series of smaller scan chains, the exact number determined by the number of XOR gates that are activated.

In the configuration shown in FIG. 2, the first scan chain S1 and the second scan chain S2 receive their test patterns from different locations of the test pattern generator. This reduces the correlation between the test patterns in the two scan chains. Moreover, the XOR gate at the input to the scan chain S2 causes further shift to the test pattern and thus results in a better random test quality.

Thus, the present invention not only allows the flexibility of using a single long scan chain or smaller partitioned scan chain, but it also results in the ability to further shift the test pattern and therefore achieve better test results because of the additional shifting of the test patterns by the XOR gates.

It is to be understood that the above-described embodiments are merely illustrative of the principles of the invention. Various modifications and changes may be made thereto by those skilled in the art which will embody the principles of the invention and fall within the spirit and scope thereof. For example, while the example given herein show the use of XOR gates inserted in the scan chain, EXCLUSIVE-NOR (NXOR) gates could also be used instead.

We claim:

1. A test system for testing an integrated circuit, said test system including a plurality of flip-flops arranged in a scan chain to effectuate scan testing of the integrated circuit, comprising:
   a first stage comprising at least one of said flip-flops;
   a second stage comprising at least another one of said flip-flops;
   a switch coupled between said first stage and said second stage;
   a memory register storing a plurality of random test vectors for input to the scan chain, to the switch, and to the integrated circuit; and
   a response analyzer coupled to the integrated circuit for compacting the response generated by the integrated circuit with bits shifted out of the first and second stages.

2. A test system as set forth in claim 1, wherein said switch comprises an exclusive-OR gate.

3. A test system as set forth in claim 2, wherein said exclusive-OR gate includes a first input coupled to an output of said first stage, a second input coupled to said memory register, and an output coupled to an input of said second stage.

4. A test system as set forth in claim 1, wherein said switch comprises an exclusive-NOR gate.

5. A test system as set forth in claim 4, wherein said first stage includes an observation point coupled to said response analyzer to route the output of said first stage to said response analyzer.

6. A test system as set forth in claim 4, wherein said exclusive-NOR gate includes a first input coupled to an output of said first stage, a second input coupled to said memory register, and an output coupled to an input of said second stage.

7. A test system as set forth in claim 6, wherein said first stage includes an observation point coupled to said response analyzer to route the output of said first stage to said response analyzer.

8. A test system for testing an integrated circuit, said test system including a plurality of flip-flops arranged in a scan chain to effectuate scan testing of the integrated circuit, comprising:
   a first stage comprising at least one of said flip-flops;
   a second stage comprising at least another one of said flip-flops;
   selection means coupled between said first stage and said second stage;
   register means for storing a plurality of random test vectors for input to the scan chain, to the selection means, and to the integrated circuit; and
   analyzing means coupled to the integrated circuit for compacting the response generated by the integrated circuit with bits shifted out of the first and second stages.

9. A test system as set forth in claim 8, wherein said selection means comprises an exclusive-OR gate.

10. A test system as set forth in claim 9, wherein said exclusive-OR gate includes a first input coupled to an output of said first stage, a second input coupled to said register means, and an output coupled to an input of said second stage.

11. A test system as set forth in claim 10, wherein said first stage includes an observation point coupled to said analyzing means to route the output of said first stage to said analyzing means.

12. A test system as set forth in claim 8, wherein said selection means comprises an exclusive-NOR gate.

13. A test system as set forth in claim 12, wherein said exclusive-NOR gate includes a first input coupled to an output of said first stage, a second input coupled to said register means, and an output coupled to an input of said second stage.

14. A test system as set forth in claim 13, wherein said first stage includes an observation point coupled to said analyzing means to route the output of said first stage to said analyzing means.

15. A method of testing an integrated circuit having a plurality of flip-flops arranged in a scan chain to effectuate partial scan testing of the integrated circuit, in which a register stores test vectors for input to the scan chain and the integrated circuit, and in which a controller controls the operation of the integrated circuit between a normal operating mode and a test mode, and in which an analyzer compacts data generated by said integrated circuit with bits shifted out of the scan register, said method comprising the steps of:
   connecting a switch between first and second adjacent flip-flops of said scan chain; and
   controlling said switch to selectively partition said scan chain into plural, shorter scan chains.

16. An improved test system for testing an integrated circuit of the type having a plurality of flip-flops arranged in a scan chain to effectuate partial scan testing of the integrated circuit, in which a register stores test vectors for input to the scan chain and the integrated circuit, and in which a controller controls the operation of the integrated circuit between a normal operating mode and a test mode, and in which an analyzer compacts data generated by said integrated circuit with bits shifted out of the scan register, the improvement comprising:

at least one selection means coupled between first and second adjacent flip-flops of said scan chain, said selection means being controllable to selectively partition said scan chain into plural, shorter scan chains.

17. An improved test system as set forth in claim 16, wherein said selection means comprises an exclusive-OR gate.

18. A test system as set forth in claim 17, wherein said exclusive-OR gate includes a first input coupled to an output of said first stage, a second input coupled to said register means, and an output coupled to an input of said second stage.

19. A test system as set forth in claim 18, wherein said first stage includes an observation point coupled to said analyzing means to route the output of said first stage to said analyzing means.

20. An improved test system as set forth in claim 16, wherein said selection means comprises an exclusive-NOR gate.

21. A test system as set forth in claim 20, wherein said exclusive-NOR gate includes a first input coupled to an output of said first stage, a second input coupled to said register means, and an output coupled to an input of said second stage.

22. A test system as set forth in claim 21, wherein said first stage includes an observation point coupled to said analyzing means to route the output of said first stage to said analyzing means.

* * * * *